United States Patent
Tatsuoka et al.

(10) Patent No.: US 9,415,446 B2
(45) Date of Patent: Aug. 16, 2016

(54) SURFACE COATED CUTTING TOOL

(71) Applicant: MITSUBISHI MATERIALS CORPORATION, Tokyo (JP)

(72) Inventors: Sho Tatsuoka, Naka-gun (JP); Naoyuki Iwasaki, Naka-gun (JP); Kenji Yamaguchi, Naka-gun (JP); Akira Osada, Moriya (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 14/424,237

(22) PCT Filed: Aug. 28, 2013

(86) PCT No.: PCT/JP2013/073026
§ 371 (c)(1),
(2) Date: Feb. 26, 2015

(87) PCT Pub. No.: WO2014/034730
PCT Pub. Date: Mar. 6, 2014

(65) Prior Publication Data
US 2015/0217378 A1    Aug. 6, 2015

(30) Foreign Application Priority Data

Aug. 28, 2012 (JP) .................. 2012-187543
Aug. 27, 2013 (JP) .................. 2013-175238

(51) Int. Cl.
*B23B 27/14* (2006.01)
*C23C 16/36* (2006.01)
(Continued)

(52) U.S. Cl.
CPC .......... *B23B 27/148* (2013.01); *C23C 16/0272* (2013.01); *C23C 16/34* (2013.01);
(Continued)

(58) Field of Classification Search
USPC ............ 51/307, 309; 428/216, 325, 336, 697, 428/698, 699, 701, 702
See application file for complete search history.

(56) References Cited

U.S. PATENT DOCUMENTS

| 4,984,940 A | 1/1991 | Bryant et al. |
| 2006/0154108 A1* | 7/2006 | Fukui .................... C23C 30/005 428/698 |

(Continued)

FOREIGN PATENT DOCUMENTS

| CN | 101568399 A | 10/2009 |
| CN | 101970716 A | 2/2011 |

(Continued)

OTHER PUBLICATIONS

Heim et al "TiAlN and TiAlCN depostion in an industrial PaCVD plant" Suface & Coatings Techn 98 (1998) p. 1553-1556.*

(Continued)

*Primary Examiner* — Archene Turner
(74) *Attorney, Agent, or Firm* — Leason Ellis LLP.

(57) ABSTRACT

A coated tool with a hard coating layer, which has an excellent hardness and heat insulating effect; and exhibits an excellent chipping resistance and an excellent fracturing resistance for a long-term usage, is provided. The hard coating layer included in the coated tool has a chemically vapor deposited alternate laminated structure, which is made of: a region A layer and a region B layer, each of which is expressed by the composition formula of $(Ti_{1-x}Al_x)(C_yN_{1-y})$; and has the average total layer thickness of 1-10 μm. In the region A layer, relationships, $0.70 \leq x \leq 0.80$ and $0.0005 \leq y \leq 0.005$, are satisfied; the average grain width W is 0.1 μm or less; and the average grain length L is 0.1 μm or less. In the region B layer, relationships, $0.85 \leq x \leq 0.95$ and $0.0005 \leq y \leq 0.005$, are satisfied; the average grain width W is 0.1-2.0 μm; and the average grain length L is 0.5-5.0 μm.

10 Claims, 1 Drawing Sheet

(51) Int. Cl.
*C23C 30/00* (2006.01)
*C23C 28/04* (2006.01)
*C23C 28/00* (2006.01)
*C23C 16/02* (2006.01)
*C23C 16/34* (2006.01)

(52) U.S. Cl.
CPC .............. *C23C 16/36* (2013.01); *C23C 28/042* (2013.01); *C23C 28/044* (2013.01); *C23C 28/42* (2013.01); *C23C 30/005* (2013.01); *B23B 2200/08* (2013.01); *B23B 2200/16* (2013.01); *B23B 2222/28* (2013.01); *B23B 2222/61* (2013.01); *B23B 2224/00* (2013.01); *B23B 2224/32* (2013.01); *B23B 2226/125* (2013.01); *B23B 2228/04* (2013.01); *B23B 2228/44* (2013.01); *B23B 2228/56* (2013.01); *Y10T 428/31678* (2015.04)

(56) References Cited

U.S. PATENT DOCUMENTS

2009/0123779 A1\* 5/2009 Endler .................... C23C 16/34
428/697

2010/0233511 A1\* 9/2010 Endler .................. C23C 16/029
428/698
2010/0323176 A1  12/2010 Van Den Berg et al.
2011/0003126 A1   1/2011 Van Den Berg et al.

FOREIGN PATENT DOCUMENTS

| CN | 103834928 A | 6/2014 |
| --- | --- | --- |
| EP | 2210692 A | 7/2010 |
| JP | 2004-066421 A | 3/2004 |
| JP | 2011-513594 A | 4/2011 |
| JP | 2011-516722 A | 5/2011 |
| JP | 2011-224715 A | 11/2011 |
| JP | 2012-166294 A | 9/2012 |
| WO | WO-2012/172895 A | 12/2012 |

OTHER PUBLICATIONS

International Search Report mailed Oct. 22, 2013 for the corresponding PCT Application No. PCT/JP2013/073026.
Office Action mailed Dec. 4, 2015 for the related Chinese Application No. 201380044540.3.

\* cited by examiner

SURFACE COATED CUTTING TOOL

CROSS-REFERENCE TO RELATED PATENT APPLICATIONS

This application is a U.S. National Phase Application under 35 U.S.C. §371 of International Patent Application No. PCT/JP2013/073026, filed Aug. 28, 2013, and claims the benefit of Japanese Patent Applications No. 2012-187543, filed Aug. 28, 2012 and No. 2013-175238, filed Aug. 27, 2013, all of which are incorporated by reference in their entirety herein. The International Application was published in Japanese on Mar. 6, 2014 as International Publication No. WO/2014/034730 under PCT Article 21(2).

FIELD OF THE INVENTION

The present invention relates to a surface coated cutting tool (hereinafter referred as "coated tool") that exhibits an excellent cutting performance for a long-term usage by having a hard coating layer with an excellent chipping resistance during high-speed intermittent cutting work of alloy steel or the like in which high heat is generated and impacting load impinges on the cutting edge.

BACKGROUND OF THE INVENTION

Conventionally, the coated tools, in which as a hard coating layer, a Ti—Al-based complex nitride layer is formed on the surface of the cutting tool body made of: tungsten carbide (hereinafter referred as WC)-based cemented carbide; titanium carbonitride (hereinafter referred as TiCN)-based cermet; or cubic boron nitride (hereinafter referred as cBN)-based ultra-high pressure sintered material (hereinafter collectively referred as "body"), by the physical vapor deposition method, are known. These coated tools exhibit an excellent wear resistance.

However, various proposals have been made for improving the hard coating layer since unusual wear such as chipping or the like is prone to occur when coated tools, on which the conventional Ti—Al-based complex nitride layer is formed, are used in high-speed intermittent cutting condition, even though they exhibit relatively excellent wear resistance.

For example, a configuration is proposed in Patent Literature 1 (PTL 1). In the configuration, a hard coating layer, which is made of the Ti and Al complex nitride satisfying $0.35 \leq X \leq 0.60$ (X is in atomic ratio) in the case where the Ti and Al complex nitride is expressed by the composition formula, $(Ti_{1-X}Al_X)N$, is formed on the surface of the cutting tool body by a physical vapor deposition method. In addition, the hard coating layer has an alternate laminated structure of the thin layer A, which is made of a granular crystal structure of the above-described (Ti, Al)N layer, and the thin layer B, which is made of a columnar crystal structure. In addition to the configuration described above: each of the thin layer A and the thin layer B has layer thickness of 0.05-2 μm; the crystal grain size of the granular crystal is set to 30 nm or less; and the crystal grain size of the columnar crystal is set to 50-500 nm. It is disclosed that the hard coating layer exhibits excellent chipping resistance, fracturing resistance, and peeling resistance in high-speed intermittent cutting work of high hardness steel by satisfying the configuration described above.

However, in this coated tool, the hard coating layer is formed by a physical vapor deposition method and it is impossible to set the Al content ratio, X, to 0.6 or more. Thus, further improvement of cutting performance is still needed.

To meet the requirements, a technique, in which the Al content ratio, X, is increased to about 0.9 by forming the hard coating layer by a chemical vapor deposition method, has been proposed.

For example, it is described in Patent Literature 2 (PTL 2) that a $(Ti_{1-X}Al_X)N$ layer, the Al content ratio of which is 0.65-0.95, can be formed by performing a chemical vapor deposition in a temperature range of 650-900° C. in a mixed reaction gas of $TiCl_4$, $AlCl_3$, and $NH_3$. What is intended in PTL 2 is improving heat insulating effect by putting an extra coating of the $Al_2O_3$ layer on top of the $(Ti_{1-X}Al_X)N$ layer. Thus, PTL 2 is silent about any effect of forming the $(Ti_{1-X}Al_X)N$ layer with the increased X value to 0.65-0.95 on the cutting performance itself.

In addition, a configuration is proposed to improve heat resistance and fatigue strength of a coated tool in Patent Literature 3 (PTL 3). In the configuration, a TiCN layer and an $Al_2O_3$ layer are provided as an inner layer. A $(Ti_{1-X}Al_X)N$ layer (X is 0.65-0.9), which is in a cubic crystal structure or a cubic crystal structure including a hexagonal crystal structure, is coated on the inner layer as an outer layer by a chemical vapor deposition method. In addition, compressive stress of 100-1100 MPa is given to the outer layer.

RELATED ART DOCUMENTS

Patent Literature

PTL 1: Japanese Unexamined Patent Application, First Publication No. 2011-224715 (A)

PTL 2: Published Japanese Translation No. 2011-516722 of the PCT International Publication (A)

PTL 3: Published Japanese Translation No. 2011-513594 of the PCT International Publication (A)

Problems to be Solved by the Present Invention

In recent years, there are strong demands for labor-saving and energy-saving in the cutting work. In responding to the demands, there is a tendency that the cutting work is performed at a higher speed and a higher efficiency. Thus, even higher unusual tool failures resistance, such as chipping resistance, fracturing resistance, peeling resistance, or the like, is required. At the same time, an excellent wear resistance for a long-term usage is required.

However, in the coated tool described in PTL 1, the Al content ratio, X, cannot be increased since the hard coating layer made of the $(Ti_{1-X}Al_X)N$ layer is formed by the physical vapor deposition method. Thus, the coated tool in PTL 1 does not have sufficient wear resistance and chipping resistance in the case where it is applied to high-speed intermittent cutting of alloy steel, for example.

In regard to the $(Ti_{1-X}Al_X)N$ layer described in PTL 2, which is formed by the chemical vapor deposition method, the Al content ratio, X, can be increased, and a cubic crystal structure can be formed. Thus, the hard coating layer with a hardness of a certain extent and an excellent wear resistance can be obtained. However, adhesion strength of the hard coating layer with the cutting tool body is not sufficient, and its toughness is inferior.

The coated tool described in PTL 3 has a hardness of a certain extent and an excellent wear resistance. However, its toughness is inferior. Thus, in the case where it is applied to high-speed intermittent cutting of alloy steel or the like, unusual tool failure, such as chipping, fracturing, peeling, and the like, is prone to occur. Accordingly, the coated tool described in PTL 3 does not exhibit a satisfactory cutting performance.

The purpose of the present invention is to provide a coated tool that exhibits: an excellent toughness; an excellent chipping resistance; an excellent wear resistance, for a long-term usage even if the coated tool is applied to high-speed intermittent cutting of alloy steel or the like.

SUMMARY OF THE INVENTION

Means to Solving the Problems

In the light of the above-described viewpoint, the inventors of the present invention conducted an intensive study to improve chipping resistance and abrasion resistance of the coated tool on which a hard coating layer made of the Ti and Al complex carbonitride (occasionally referred as "(Ti, Al)(C, N)" or "$(Ti_{1-X}Al_X)(C_YN_{1-Y})$") is formed by chemical vapor deposition. Then they obtained findings described below.

In conventional coated tools, the surface coated cutting tool includes at least one $(Ti_{1-X}Al_X)(C_YN_{1-Y})$ layer. In addition, the $(Ti_{1-X}Al_X)(C_YN_{1-Y})$ layer with columnar crystal grains along with the direction perpendicular to the surface of the cutting tool body is formed in the hard coating layer with a predetermined average total layer thickness. In this case, the surface coated cutting tool obtains a high wear resistance. On the other side of the coin, the higher the anisotropy in the crystal structure of the $(Ti_{1-X}Al_X)(C_YN_{1-Y})$ layer, the lower the toughness of the $(Ti_{1-X}Al_X)(C_YN_{1-Y})$ layer. As a result, chipping resistance and fracturing resistance of the surface coated cutting tool decrease, making it impossible for the coated tool to exhibit a sufficient wear resistance for long-term usage. Also, the length of the tool life is not satisfactory.

Under the circumstances described above, the inventors of the present invention conducted an intensive study on the $(Ti_{1-X}Al_X)(C_YN_{1-Y})$ layer which is a constituent of the hard coating layer. Then, they found that the chipping resistance and the fracturing resistance of the hard coating layer can be improved by reducing the anisotropy in the crystal structure of the $(Ti_{1-X}Al_X)(C_YN_{1-Y})$ layer to increase its toughness.

Specifically, by configuring the $(Ti_{1-X}Al_X)(C_YN_{1-Y})$ layer, which is a constituent of the hard coating layer, to be an alternated laminated layer of: the region A layer, which is made of a $(Ti_{1-X}Al_X)(C_YN_{1-Y})$ layer mainly in a micro granular crystal structure; and the region B layer, which is made of a $(Ti_{1-X}Al_X)(C_YN_{1-Y})$ layer mainly in a columnar crystal structure, the technical effect explained below can be obtained. By having the above-described configuration, the alternate laminated structure, which is made of: the region A layer of the $(Ti_{1-X}Al_X)(C_YN_{1-Y})$ layer with a micro granular crystal structure exhibiting an excellent toughness; and the region B layer of the $(Ti_{1-X}Al_X)(C_YN_{1-Y})$ in a columnar crystal structure exhibiting an excellent wear resistance, functions as if it were a single layer with the traits of each of the region A layer and the region B layer. Because of this, the anisotropy is reduced in the crystal structure of the $(Ti_{1-X}Al_X)(C_YN_{1-Y})$ layer in the hard coating layer with the above-described characteristics compared to the conventional hard coating layer. As a result, the chipping resistance and the fracturing resistance of the hard coating layer are improved, and the coated tool exhibits an excellent wear resistance for a long-term usage.

The $(Ti_{1-X}Al_X)(C_YN_{1-Y})$ layer configured as explained above can be formed by the chemical vapor deposition method described below, for example. In the chemical vapor deposition method, trimethyl aluminum $(Al(CH_3)_3)$ is included in the reaction gas component.

(a) A $(Ti_{1-X}Al_X)(C_YN_{1-Y})$ layer with a columnar structure with a predetermined intended layer thickness is formed (region B layer) by performing a thermal CVD method on the surface of the cutting tool body for a predetermined time in the condition of: the reaction gas composition (volume %) including 1.0-2.0% of $TiCl_4$, 1.0-2.0% of $Al(CH_3)_3$, 3.0-5.0% of $AlCl_3$, 3-6% of $NH_3$, 6-10% of $N_2$, 0-1.0% of $C_2H_4$, and the balance $H_2$; the pressure of the reaction atmosphere of 2-5 kPa; and the temperature of the reaction atmosphere of 700-900° C.

(b) Then, the layer forming process (a) is stopped. Then, a $(Ti_{1-X}Al_X)(C_YN_{1-Y})$ layer with a micro granular structure with a predetermined intended layer thickness is formed (region A layer) by performing a thermal CVD method for a predetermined time in the condition of: the reaction gas composition (volume %) including 3.0-4.0% of $TiCl_4$, 3.0-5.0% of $Al(CH_3)_3$, 1.0-2.0% of $AlCl_3$, 7-10% of $NH_3$, 6-10% of $N_2$, 0-1.0% of $C_2H_4$, and the balance $H_2$; the pressure of the reaction atmosphere of 2-5 kPa; and the temperature of the reaction atmosphere of 700-900° C.

(c) Then, by repeating the above-described processes (a) and (b) in a predetermined number of times, the hard coating layer, which is made of the alternate laminated structure of the $(Ti_{1-X}Al_X)(C_YN_{1-Y})$ layer with the columnar structure and the $(Ti_{1-X}Al_X)(C_YN_{1-Y})$ layer with the micro granular structure, can be formed.

(d) In the viewpoint of improving the wear resistance, it is preferable that the outermost layer of the alternate laminated structure is the $(Ti_{1-X}Al_X)(C_YN_{1-Y})$ layer with the micro granular structure, which is the region A layer, since the $(Ti_{1-X}Al_X)(C_YN_{1-Y})$ layer with the micro granular structure has more excellent toughness than the $(Ti_{1-X}Al_X)(C_YN_{1-Y})$ layer with the columnar structure.

In the case where the Al content ratio, X, which is an Al content relative to a total content amount of Ti and Al in the $(Ti_{1-X}Al_X)(C_YN_{1-Y})$ layer with the micro granular structure, is $0.7 \leq X \leq 0.8$ and the Al content ratio, x, which is an Al content relative to a total content amount of Ti and Al in the $(Ti_{1-x}Al_x)(C_YN_{1-Y})$ layer with the columnar structure, is $0.85 \leq x0.95$, the fracturing resistance and the chipping resistance are improved particularly. In the surface coated cutting tool with the above-described characteristics, the hard coating layer exhibits an excellent cutting performance for a long-term usage even if it is used for high-speed intermittent cutting work of steel or cast iron in which intermittent and impacting load impinges on the cutting edge.

The present invention is made based on the finding described above, and has aspects shown below.

(1) A surface coated cutting tool including: a cutting tool body made of any one of tungsten carbide-based cemented carbide, titanium carbonitride-based cermet, and cubic boron nitride-based ultra-high pressure sintered material; and a hard coating layer provided on a surface of the cutting tool body, wherein the hard coating layer includes at least a Ti and Al complex carbonitride layer formed by a chemical vapor deposition method, the complex carbonitride layer includes an alternate laminated structure made of a region A layer and a region B layer, each of which is represented by a composition formula $(Ti_{1-X}Al_X)(C_yN_{1-y})$, the alternate laminated structure having an average total layer thickness of 1-10 µm, in the region A layer, a content ratio x, which is an Al content relative to a total content amount of Ti and Al, satisfies $0.70 \leq x \leq 0.80$; a content ratio y, which is a C content relative to a total content amount of C and N, satisfies 0.0005≤y≤0.005, each of x and y being atomic ratio; an average grain width W, which is an average value of grain width in a plane parallel to the surface of the cutting tool body, is 0.1 µm or less; and an average grain length L, which is an average value of grain length in a direction perpendicular to the surface of the cutting tool body, is 0.1 µm or less, in the region B layer, a content ratio x, which is an Al content relative to a total content amount of Ti and Al, satisfies 0.85≤x≤0.95; a content ratio y, which is a C content relative to a total content amount of C and N, satisfies 0.0005≤y≤0.005, each of x and y being atomic ratio; an average grain width W, which is an average value of grain width in a plane parallel to the surface of the cutting tool body, is 0.1 µm to 2.0 µm; and an average grain length L, which is an average value of grain length in a direction perpendicular to the surface of the cutting tool body, is 0.5 µm to 5.0 µm, the alternate laminated structure includes at least a pair of the region A layer and the region B layer which are alternately arranged, and a top layer of the alternate laminated structure is the region A layer.

(2) The surface coated cutting tool according to (1) described above, wherein in regard to the region A layer, in a case where a crystal orientation of each of crystal grains is analyzed in a vertical section direction of the Ti and Al complex carbonitride layer using an electron backscatter diffraction apparatus:

both of: a cubic crystal phase, in which an electron backscatter diffraction pattern of a cubic crystal lattice is observed; and a hexagonal crystal phase, in which an electron backscatter diffraction pattern of a hexagonal crystal lattice is observed, are detected; and an area ratio of the cubic crystal phase relative to a total area of the cubic crystal phase and the hexagonal crystal phase is 50% or more, and in regard to the region B layer, an area ratio of the hexagonal crystal phase relative to a total area of the cubic crystal phase and the hexagonal crystal phase is 50% or more.

(3) The surface coated cutting tool according to (1) or (2) described above, wherein in a case where a lattice constant, a, of the cubic crystal grain is obtained in the complex carbonitride layer from X-ray diffraction, the lattice constant a of the cubic crystal grain satisfies a relationship, $0.05a_{TiN}+0.95a_{AlN} \leq a \leq 0.4a_{TiN}+0.6a_{AlN}$, relative to a lattice constant $a_{TiN}$, which is a lattice constant of a cubic TiN, and a lattice constant $a_{AlN}$, which is a lattice constant of a cubic AlN.

(4) The surface coated cutting tool according to any one of (1) to (3) described above, wherein the hard coating layer is formed by a chemical vapor deposition method, a reaction gas component of which includes at least trimethyl aluminum.

(5) The surface coated cutting tool according to (1) or (2) described above, wherein an outermost layer, which is made of at least one layer selected from a group consisting of: $Al_2O_3$ layer; TiN layer; TiCN layer; and TiCNO layer, is formed on the Ti and Al complex carbonitride layer as a layer in an outermost part of the surface coated cutting tool.

(6) The surface coated cutting tool according to (1) or (2) described above, wherein an intermediate layer, which is made of TiN layer or TiCN layer, is formed between the surface of the cutting tool body and one of the region B layer closest to the cutting tool body.

(7) The surface coated cutting tool according to (5) described above, wherein an intermediate layer, which is made of TiN layer or TiCN layer, is formed between the surface of the cutting tool body and one of the region B layer closest to the cutting tool body.

(8) The surface coated cutting tool according to (1) or (2) described above, wherein an average total layer thickness of the complex carbonitride layer relative to an average layer thickness of the hard coating layer is 60% or more and 100% or less.

(9) The surface coated cutting tool according to (1) or (2) described above, wherein one of the region A layer farthest from the cutting tool body is the outermost layer of the surface coated cutting tool, and the one of the region B layer closest to the cutting tool body contacts the surface of the cutting tool body directly.

(10) The surface cutting tool body according to (1) or (2) described above, wherein a ratio between an average total layer thickness of the region A layer and an average total layer thickness of the region B layer is in a range between 1:9 to 9:1.

Effects of the Invention

An aspect of the present invention is a surface coated cutting tool (hereinafter referred as the surface coated cutting tool of the present invention). In the surface coated cutting tool of the present invention, the hard coating layer is provided on the surface of the cutting tool body made of any one of tungsten carbide-based cemented carbide, titanium carbonitride-based cermet, and cubic boron nitride-based ultra-high pressure sintered material. In this surface coated cutting tool, the hard coating layer includes an alternate laminated structure, which is chemically vapor deposited and made of a region A layer and a region B layer. Each of the region A layer and the region B layer is represented by the composition formula $(Ti_{1-x}Al_x)(C_yN_{1-y})$. The alternate laminated structure has the average total layer thickness of 1-10 µm. In the region A layer, the content ratio x, which is the Al content relative to the total content amount of Ti and Al, satisfies 0.70≤x≤0.80; the content ratio y, which is the C content relative to the total content amount of C and N, satisfies 0.0005≤y≤0.005, each of x and y being atomic ratio. In addition, the average grain width W, which is the average value of grain width in the plane parallel to the surface of the cutting tool body, is 0.1 µm or less; and the average grain length L, which is the average value of grain length in the direction perpendicular to the surface of the cutting tool body, is 0.1 µm or less. In the region B layer, the content ratio x, which is the Al content relative to the total content amount of Ti and Al, satisfies 0.85≤x≤0.95; the content ratio y, which is the C content relative to the total content amount of C and N, satisfies 0.0005≤y≤0.005, each of x and y being atomic ratio. In addition, the average grain width W, which is the average value of grain width in the plane parallel to the surface of the cutting tool body, is 0.1 µm to 2.0 µm; and the average grain length L, which is the average value of grain length in the direction perpendicular to the surface of the cutting tool body, is 0.5 µm to 5.0 µm. In addition, the top layer of the alternate laminated structure is the region A layer. By having the configurations described above, the alternate laminated structure, which is made of: the region A layer of the $(Ti_{1-x}Al_x)(C_yN_{1-y})$ layer with the micro granular crystal structure exhibiting an excellent toughness and an excellent heat insulating effect; and the region B layer of the $(Ti_{1-x}Al_x)(C_yN_{1-y})$ in the columnar crystal structure exhibiting an excellent wear resistance and an excellent heat conductivity, functions as if it were a single layer with the traits of each of the region A layer and the region B layer. As a result, the technical effect, in which the chipping resistance and the fracturing resistance of the hard coating layer with the above-described configurations are improved, can be obtained. In addition, this hard coating layer exhibits an excellent cutting performance for a long-term usage; and a longer service life of the cutting tool can be obtained compared to the conventional hard coating layer.

DETAILED DESCRIPTION OF THE INVENTION

The embodiments of the present invention are explained in detail below.

Figure 1:
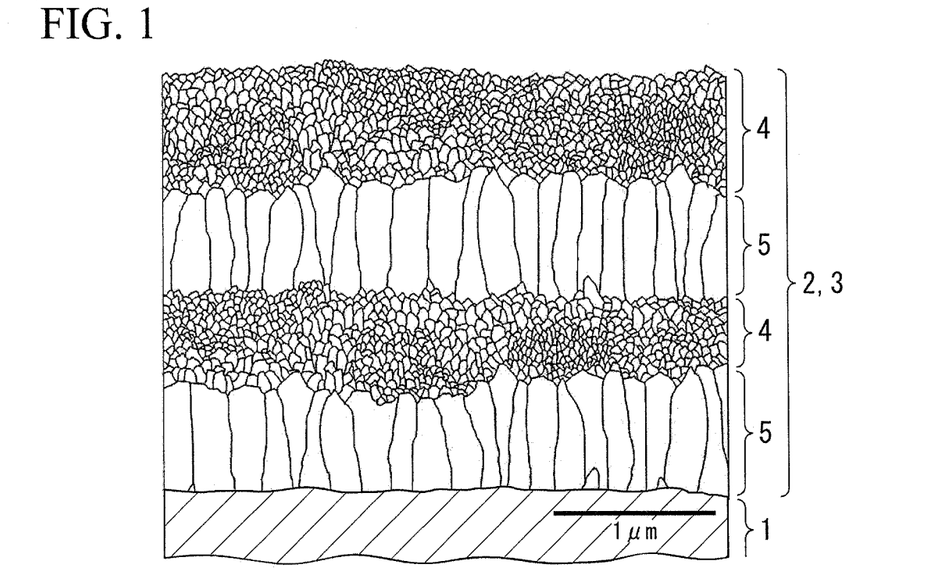
FIG. 1 is a schematic diagram of the film configuration indicating the cross-section of the hard coating layer included in the surface coated cutting tool of the first embodiment of the present invention.

FIG. 1 is a schematic diagram of the film configuration indicating the cross-section of the hard coating layer (occasionally referred as the hard coating layer of the present invention) included in the surface coated cutting tool of the first embodiment of the present invention.

The hard coating layer 2 is formed on the cutting tool body 1. The hard coating layer 2 includes the complex carbonitride $(Ti_{1-X}Al_X)(C_yN_{1-y})$ layer 3 made of the region A layer 4 and the region B layer 5. The complex carbonitride layer 3 includes the alternate laminated structure of the region A layer 4 and the region B layer 5. In the embodiment indicated in FIG. 1, the hard coating layer 2 is made of two sets of the region A layers 4 and the region B layers 5 alone. In this embodiment, one of the region B layers is formed directly on the cutting tool body, and one of the region A layers is formed as the outermost layer. The region A layer 4 is made of the micro granular structure, and the region B layer is made of the columnar structure.

Figure 2:
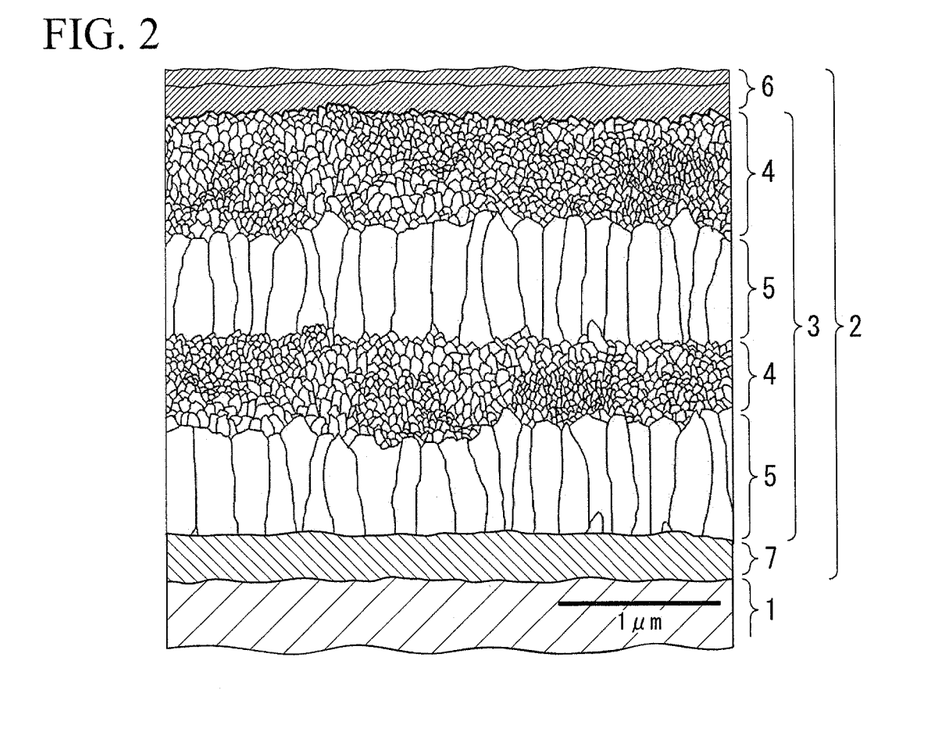
FIG. 2 is a schematic diagram of the film configuration indicating the cross-section of the hard coating layer included in the surface coated cutting tool of another embodiment of the present invention.

FIG. 2 is a schematic diagram of the film configuration indicating the cross-section of the hard coating layer included in the surface coated cutting tool of another embodiment of the present invention.

As in the first embodiment, the hard coating layer 2 is formed on the cutting tool body 1 in this embodiment. The hard coating layer 2 includes the complex carbonitride $(Ti_{1-X}Al_X)(C_yN_{1-y})$ layer 3 made of the region A layer 4 and the region B layer 5. The complex carbonitride layer 3 includes the alternate laminated structure of the region A layer 4 and the region B layer 5. In the embodiment indicated in FIG. 2, the hard coating layer 2 includes the outermost layer 6 and the intermediate layer 7, in addition to the complex carbonitride layer 3.

The outermost layer 6 is formed on the region A layer 4 farthest from the cutting tool body 1 as the layer formed in the outermost portion of the surface coated cutting tool to form the outermost layer of the surface coated cutting tool. A preferable layer thickness of the outermost layer 6 is 1-5 µm.

The intermediate layer 7 is formed between the cutting tool body 1 and the region B layer 5 closest to the cutting tool body 1. The lower surface of the intermediate layer 7 directly contacts the surface of the cutting tool body 1. The upper surface of the intermediate layer directly contacts the lower surface of the region B layer 5 closest to the cutting tool body 1. A preferable layer thickness of the intermediate layer 7 is 1-5 µm.

It is preferable that the average total layer thickness of the complex carbonitride layer 3 relative to the average layer thickness of the hard coating layer 2 is 60% or more and 100% or less.

Preferably, the outermost layer 6 is made of at least one layer selected from a group consisting of: $Al_2O_3$ layer; TiN layer; TiCN layer; and TiCNO layer. By having the outermost layer 6, crater wear resistance, flank face wear resistance, thermal barrier property and the like of the hard coating layer 2 are further improved.

As the intermediate layer 7, TiN layer, TiCN layer, and the like are preferable. By having the intermediate layer 7, flank face wear resistance, peeling resistance, chipping resistance, and the like of the hard coating layer 2 are further improved.

Only one of the outermost layer 6 and the intermediate layer 7 may be formed in the surface coated cutting tool of the present invention.

As in the embodiment indicated in FIG. 1, the region A layer 4 is made of the micro granular structure and the region B layer 5 is made of the columnar structure in the embodiment indicted in FIG. 2.

Average Layer Thickness of the Complex Carbonitride Layer:

The hard coating layer included in the surface coated cutting tool of the present invention includes the chemically vapor deposited alternate laminated structure, which is made of the region A layer and the region B layer, each of which is represented by the composition formula $(Ti_{1-x}Al_x)(C_yN_{1-y})$. The Ti and Al complex carbonitride layers, which constitute the alternate laminated structure, have a high hardness and an excellent wear resistance. In particular, when the average total layer thickness of the Ti and Al complex carbonitride layers is 1-10 µm, advantageous effect of them are distinctly exerted. The reason for this is that: if the average total layer thickness were less than 1 µm, it would be impossible to obtain sufficient wear resistance for a long-term usage since the layer thickness is too thin; and if the average total layer thickness exceeded 10 µm, it would be prone to be chipped since the crystal grain size of the Ti and Al complex carbonitride layer tends to be coarse. Therefore, the average total layer thickness of the complex carbonitride layer is set to 1-10 µm.

Region A Layer Constituting the Alternate Laminated Structure;

In the region A layer, the content ratio x, which is the Al content relative to the total content amount of Ti and Al, satisfies $0.70 \leq x \leq 0.80$; the content ratio y, which is the C content relative to the total content amount of C and N, satisfies $0.0005 \leq y \leq 0.005$ (each of x and y is atomic ratio). When the composition satisfies the above-described relationships, toughness of the crystal grains becomes even higher. Furthermore, the average grain width W, which is the average value of grain width in the plane parallel to the surface of the cutting tool body, is set to 0.1 µm or less; and the average grain length L, which is the average value of grain length in the direction perpendicular to the surface of the cutting tool body, is set to 0.1 µm or less. When the above-described conditions are satisfied, the $(Ti_{1-x}Al_x)(C_yN_{1-y})$ layer constituting the region A layer becomes the micro granular structure to exhibit an excellent toughness. On the other hand, when the composition is deviated from the above-described range, the $(Ti_{1-x}Al_x)(C_yN_{1-y})$ layer does not form the micro granular structure satisfying the average grain width W of 0.1 µm or less and the average grain length L of 0.1 µm or less. Eventually, the desired toughness cannot be obtained.

Region B Layer Constituting the Alternate Laminated Structure;

In the region A layer, the content ratio x, which is the Al content relative to the total content amount of Ti and Al, satisfies $0.85 \leq x \leq 0.95$; the content ratio y, which is the C content relative to the total content amount of C and N, satisfies 0.0005≤y≤0.005 (each of x and y is atomic ratio). When the composition satisfies the above-described relationships, hardness of the crystal grains becomes even higher. Furthermore, an average grain width W, which is the average value of grain width in the plane parallel to the surface of the cutting tool body, is set to 0.1-2.0 µm; and the average grain length L, which is the average value of grain length in the direction perpendicular to the surface of the cutting tool body, is set to 0.5-5.0 µm. When the above-described conditions are satisfied, the $(Ti_{1-x}Al_x)(C_yN_{1-y})$ layer constituting the region B layer becomes the columnar structure to exhibit an excellent wear resistance. On the other hand, when the composition is deviated from the above-described range, the $(Ti_{1-x}Al_x)(C_yN_{1-y})$ layer does not form the columnar structure satisfying the average grain width W of 0.1-2.0 µm and the average grain length L of 0.5-5.0 µm. Eventually, the desired wear resistance cannot be obtained.

Furthermore, by having the region A layer and the region B layer constituting the alternate laminated structure, the alternate laminated structure, which is made of: the region A layer of the $(Ti_{1-x}Al_x)(C_yN_{1-y})$ layer with the micro granular crystal structure exhibiting an excellent toughness and an excellent heat insulating effect; and the region B layer of the $(Ti_{1-x}Al_x)(C_yN_{1-y})$ in the columnar crystal structure exhibiting an excellent wear resistance and an excellent heat conductivity, functions as if it were a single layer with the traits of each of the region A layer and the region B layer. Because of this, the hard coating layer with the above-described characteristics retains an excellent cutting performance for a long term compared to the conventional hard coating layer made of a single layer. The alternate laminated structure in the present invention means that there are at least one layer of the region A layer and at least one layer of the region B layer arranged alternately along the film thickness direction. In terms of the lamination number of times of the region A layer and the region B layer included in the alternate laminated structure, in the case where one set is defined as adjacent region A layer and region B layer, it is necessary for at least one set to exist. Taking account of: labor and cost needed for formation of the hard coating layer; and effects to be obtained, a preferable lamination number of times of the region A layer and the region B layer is 2 to 8 (1 to 4 sets).

The optimum configuration of the ratio of the average total layer thickness of the complex carbonitride layer 3 relative to the average layer thickness of the hard coating layer 2 differs depending on the purpose of the surface coated cutting tool. However, preferably it is 60% or more and 100% or less. In the case where it is 60% or more, the layer obtains an excellent toughness for broad varieties of purposes of the surface coated cutting tool and exhibits an excellent chipping resistance and an excellent wear resistance for a long-term usage.

It is preferable that the ratio between the average total layer thickness of the region A layer included in the complex carbonitride layer 3 and the average total layer thickness of the region B layer included in the complex carbonitride layer 3 (the total layer thickness of the region A layers:the total layer thickness of the region B layers) is in the range between 1:9 to 9:1. If the ratio between the total layer thickness of the region A layers to the total layer thickness of the region B layers is in the range of 1:9 to 9:1, it could be set to an appropriate ratio depending on the purpose of the surface coated cutting tool taking account of required hardness and viscosity. In the case where hardness is prioritized, the ratio of the region B layer is increased within the range. In the case where viscosity is prioritized, the ratio of the region A layer is increased within the range.

In addition, in the viewpoint of improving the wear resistance, it is preferable that the outermost layer of the alternate laminated structure is the $(Ti_{1-x}Al_x)(C_yN_{1-y})$ layer with the micro granular structure, which is the region A layer, since the $(Ti_{1-x}Al_x)(C_yN_{1-y})$ layer with the micro granular structure has more excellent toughness on the cutting edge than the $(Ti_{1-x}Al_x)(C_yN_{1-y})$ layer with the columnar structure.

Trace Amount of C Included in the Region A Layer and the Region B Layer:

There is a trance amount of C expressed in the range of 0.0005≤y≤0.005 in the case where y is the C content (atomic ratio) relative to the total content amount of C and N in the Ti and Al complex carbonitride layer constituting the region A layer and the region B layer. As described above, because of the region A layer and the region B layer including the trace amount of C, adhesiveness and lubricity of the region A layer and the region B layer improve to decrease impact during cutting. As a result, the fracturing resistance and the chipping resistance of the hard coating layer with the alternate laminated structure are improved.

Area Ratio Occupied by the Cubic Crystal Phase in the Region A Layer:

More preferably, in regard to the region A layer, in the case where the crystal orientation of each of crystal grains is analyzed in the vertical section direction of the Ti and Al complex carbonitride layer using an electron backscatter diffraction apparatus: both of: the cubic crystal phase, in which the electron backscatter diffraction pattern of the cubic crystal lattice is observed; and the hexagonal crystal phase, in which the electron backscatter diffraction pattern of the hexagonal crystal lattice is observed, are detected; and the area ratio of the cubic crystal phase relative to the total area of the cubic crystal phase and the hexagonal crystal phase is 50% or more. By having the area ratio occupied by the cubic crystal phase in the region A layer in 50% or more, hardness of the region A layer increases to improve the wear resistance further in addition to the excellent toughness.

Area Ratio Occupied by the Hexagonal Crystal Phase in the Region B Layer:

More preferably, in regard to the region B layer, in the case where the crystal orientation of each of crystal grains is analyzed in the vertical section direction of the Ti and Al complex carbonitride layer using an electron backscatter diffraction apparatus: both of: the cubic crystal phase, in which the electron backscatter diffraction pattern of the cubic crystal lattice is observed; and the hexagonal crystal phase, in which the electron backscatter diffraction pattern of the hexagonal crystal lattice is observed, are detected; and the area ratio of the hexagonal crystal phase relative to the total area of the cubic crystal phase and the hexagonal crystal phase is 50% or more. By having the area ratio occupied by the hexagonal crystal phase in the region B layer in 50% or more, thermal stability of the region B layer increases to improve plastic deformability in addition to the excellent wear resistance.

Lattice Constant, a, of the Cubic Crystal Grain in the Complex Carbonitride Layer:

In the case where the lattice constant, a, of the cubic crystal grain is obtained in the complex carbonitride layer by performing a X-ray diffraction test using an X-ray diffraction apparatus, Cu-Kα ray being the radiation source, the lattice constant, a, of the cubic crystal grain satisfies the relationship, $0.05a_{TiN}+0.95a_{AlN} \le a \le 0.4a_{TiN}+0.6a_{AlN}$, relative to the lattice constant $a_{TiN}$: 4.24173 Å of the cubic TiN (JCPDS00-038-1420), which is the lattice constant of a cubic TiN, and the lattice constant $a_{AlN}$: 4.045 Å of the cubic AlN (JCPDS00-046-1200), which is the lattice constant of the cubic AlN. When the above-described relationships are satisfied, the layer exhibits even higher hardness and even higher heat conductivity. Because of these, the layer obtains an excellent thermal shock resistance in addition to the excellent wear resistance.

Next, the coated tool of the present invention is specifically explained by Examples.

Examples 1

Cutting tool bodies A-D made of WC-based cemented carbide were produced as explained below. First, as raw material powders, the WC powder, the TiC powder, the ZrC powder, the TaC powder, the NbC powder, the $Cr_3C_2$ powder, and the Co powder, all of which had the average grain sizes of 1-3 µm, were prepared. Then, these raw material powders were blended in the blending composition shown in Table 1. Then, wax was added to the blended mixture, and further mixed in acetone for 24 hours with a ball mill. After drying under reduced pressure, the mixtures were press-molded into green compacts with a predetermined shape under pressure of 98 MPa. Then, the obtained green compacts were sintered in vacuum in the condition of 5 Pa vacuum at the predetermined temperature in the range of 1370-1470° C. for 1 hour retention. After sintering, the cutting tool bodies A-D, which had the insert-shape defined by ISO-SEEN1203AFSN and made of WC-based cemented carbide, were produced.

In addition, cutting tool bodies a-d made of TiCN-based cermet were produced as explained below.

As raw material powders, the TiCN powder (TiC/TiN=50/50 in mass ratio), the $Mo_2C$ powder, the ZrC powder, the NbC powder, the TaC powder, the WC powder, the Co powder, and the Ni powders, all of which had the average grain sizes of 0.5-2 were prepared. These raw material powders were blended in the blending composition shown in Table 2. Then, with a ball mill, the obtained mixtures were subjected to wet-mixing for 24 hours. After drying, the mixtures were press-molded into green compacts under pressure of 98 MPa. The obtained green compacts were sintered in the condition of: in nitrogen atmosphere of 1.3 kPa; at a temperature of 1540° C.; and for 1 hour of the retention time. After sintering, the cutting tool bodies a-d, which had the insert-shape defined by ISO-SEEN1203AFSN and made of TiCN-based cermet, were produced.

Next, the coated tools of the present invention 1-15 were produced by performing following the processes (a)-(c) explained below.

(a) The $(Ti_{1-X}Al_X)(C_YN_{1-Y})$ layer (region B layer) in the columnar structure, which has the average grain width W and the average grain length L shown in Table 5, is formed on the surfaces of the cutting tool bodies A-D and the cutting tool bodies a-d using a standard chemical vapor deposition apparatus by performing a thermal CVD for a predetermined time in the formation conditions F-J shown in Table 3. In the formation conditions F-J, the reaction gas composition (volume %) includes: 1.0-2.0% of $TiCl_4$; 1.0-2.0% of $Al(CH_3)_3$; 3.0-5.0% of $AlCl_3$; 3-6% of $NH_3$; 6-10% of $N_2$; 0-1% of $C_2H_4$; and the $H_2$ balance. The pressure of the reaction atmosphere is 2-5 kPa. The temperature of the reaction atmosphere is 700-900° C.

(b) After that, the film forming process (a) is stopped. Then, the $(Ti_{1-X}Al_X)(C_YN_{1-Y})$ layer (region A layer) in the micro granular structure, which has the average grain width W and the average grain length L shown in Table 5, is formed using a standard chemical vapor deposition apparatus by performing a thermal CVD for a predetermined time in the formation conditions A-E shown in Table 3. In the formation conditions A-E, the reaction gas composition (volume %) includes: 3.0-4.0% of $TiCl_4$; 3.0-5.0% of $Al(CH_3)_3$; 1.0-2.0% of $AlCl_3$; 7-10% of $NH_3$; 6-10% of $N_2$; 0-1% of $C_2H_4$; and the $H_2$ balance. The pressure of the reaction atmosphere is 2-5 kPa. The temperature of the reaction atmosphere is 700-900° C.

(c) The hard coating layers made of the alternate laminated structure of the $(Ti_{1-X}Al_X)(C_YN_{1-Y})$ layer with the columnar structure and the $(Ti_{1-X}Al_X)(C_YN_{1-Y})$ layer with the micro granular structure having the intended total layer thicknesses shown in Table 5 are formed by repeating a single set consisting of the above-described film forming processes (a) and (b) numbers of times specified in Table 5.

(d) In the viewpoint of improving chipping resistance, it is preferable that the outermost layer of the alternate laminated structure is the $(Ti_{1-X}Al_X)(C_YN_{1-Y})$ layer with the micro granular structure, which is the region A layer, since the $(Ti_{1-X}Al_X)(C_YN_{1-Y})$ layer with the micro granular structure has more excellent toughness than the $(Ti_{1-X}Al_X)(C_YN_{1-Y})$ layer with the columnar structure.

In regard to the coated tools of the present invention 11-15, the lower layer and/or the upper layer of the complex carbonitride layer were formed as shown in Table 5 in the forming condition shown in Table 4.

In regard to the Ti and Al complex carbonitride layers constituting the hard coating layers of the coated tools of the present invention 1-15, multiple fields of view were observed by using a scanning electron microscope (magnifying power: ×5000 to ×20000). In the observation, the presence of the region B layer, which was made of the $(Ti_{1-X}Al_X)(C_YN_{1-Y})$ layer with the columnar structure, and the region A layer, which was made of the $(Ti_{1-X}Al_X)(C_YN_{1-Y})$ layer with the micro granular structure, was confirmed as indicated in the schematic diagram of the film configuration shown in FIG. 1.

In addition, for a comparison purpose, the Ti and Al complex carbonitride layers, the hard coating layer of which was a single layer or included an alternate laminated structure, were formed by vapor deposition on the surfaces of the tool bodies A-D and the tool bodies a-d, in the conditions shown in Table 3 and in the intended total layer thicknesses (µm) shown in Table 6 as in the coated cutting tools of the present invention 1-15. At this time, the separate formation of the $(Ti_{1-X}Al_X)(C_YN_{1-Y})$ layer with the columnar structure and the $(Ti_{1-X}Al_X)(C_YN_{1-Y})$ layer with the micro granular structure was not performed. Thus, an alternate laminated structure solely made of the $(Ti_{1-X}Al_X)(C_YN_{1-Y})$ layer with the columnar structure, an alternate laminated structure solely made of the $(Ti_{1-X}Al_X)(C_YN_{1-Y})$ layer with the micro granular structure, or a $(Ti_{1-X}Al_X)(C_YN_{1-Y})$ layer in a single-layered structure of any one of these layers, was formed. The comparative coated cutting tools 1-8, and 11-15 were produced as explained above.

In regard to the comparative coated cutting tools 11-15, the lower layer and/or the upper layer of the complex carbonitride layer were formed as shown in Table 6 in the forming condition shown in Table 5.

For purpose of reference, the reference coated tools 9 and 10 shown in Table 6 were produced by forming the $(Ti_{1-X}Al_X)(C_YN_{1-Y})$ layer of the reference example on the surface of the cutting tool body A and cutting tool body a in the intended layer thickness with a standard physical vapor deposition by arc-ion plating.

The conditions for the arc-ion plating were as explained below.

(a) The bodies A and a were subjected to ultrasonic cleaning in acetone. Then, the cleaned tool bodies A and a in a dried state were set along the outer peripheral part in positions spaced away from the central axis in a predetermined distance in the radius direction on the rotating table in the arc-ion plating apparatus. As the cathode electrode (vaporization source), an Al—Ti alloy with a predetermined composition was placed.

(b) Inside of the apparatus was heated to 500° C. by a heater while retaining vacuum less than $10^{-2}$ Pa by exhausting atmosphere in the apparatus. Then, direct current bias voltage of −1000V was applied to the bodies rotating and orbiting on the rotation table. At the same time, arc discharge was generated by flowing current of 200 A between the cathode electrode made of the Al—Ti alloy and the anode electrode. By following the procedure described above, Al and Ti ions were formed in the apparatus to perform bombard cleaning on the surfaces of the tool bodies.

(c) Next, direct current bias voltage of −50V was applied to the tool bodies rotating and orbiting on the rotating table while turning the atmosphere in the apparatus to the reaction atmosphere of 4 Pa by introducing nitrogen gas as a reaction gas in the apparatus. At the same time, arc discharge was generated by flowing current of 120 A between the cathode electrode (vaporization source) made of the Al—Ti alloy and the anode electrode. By following above-described procedure, the (Al, Ti)N layers with the intended average compositions and the intended average layer thicknesses were formed on the surfaces of the bodies by vapor deposition and the coated-cutting tools of the reference example 9 and 10 were produced.

The cross sections of each constituent layer of: the coated cutting tools of the present invention 1-15; the comparative coated cutting tools 1-8 and 11-15; and the reference coated tools 9 and 10, were measured by using a scanning electron microscope (magnifying power: ×5000). The average layer thicknesses were obtained by averaging layer thicknesses measured at 5 points within the observation viewing field. In any measurement, the obtained average layer thickness was practically the same as the intended total layer thicknesses shown in Tables 5 and 6.

In regard to the average Al content ratio, x, of the complex nitride layer or the complex carbonitride layer, an electron beam was irradiated to the samples by using EPMA (Electron-Probe-Micro-Analyser). Then, the average Al content ratio, x, was obtained from 10-point average of the analysis results of the characteristic X-ray. The average C content ratio, y, was obtained by secondary-ion-mass-spectroscopy (SIMS). An ion beam was irradiated on the range of 70 μm×70 μm from the front surface side of the sample. In regard to the components released by sputtering effect, concentration measurement in the depth direction was performed. The average C content ratio, y, indicates the average value in the depth direction of the Ti and Al complex nitride layer or the Ti and Al complex carbonitride layer.

In regard to the coated cutting tools of the present invention 1-15; the comparative coated cutting tools 1-8 and 11-15; and the reference coated tools 9 and 10, the average grain width W was obtained: by measuring the grain width of crystal grains with the micro granular structured $(Ti_{1-X}Al_X)(C_YN_{1-Y})$ layer constituting the region A layer of the alternate laminated structure of the hard coating layer in the parallel direction to the surface of the cutting tool body, each of the crystal grains being existed in the length range of 10 μM horizontal to the surface of the cutting tool body by using a scanning electron microscope (magnifying power: ×5000 and ×20000); and by calculating the average value of the grains within the measurement range. The average grain length L was obtained: by measuring the grain length in the perpendicular direction to the surface of the cutting tool body; and by calculating the average value of the grains within the measurement range. In addition, the average grain width W was obtained: by measuring the grain width in the parallel direction to the surface of the cutting tool body, each crystal grain being in the columnar structured $(Ti_{1-X}Al_X)(C_YN_{1-Y})$ layer constituting the region B layer of the alternate laminated structure of the hard coating layer; and by calculating the average value of the grains within the measurement range. The average grain length L was obtained: by measuring the grain length in the perpendicular direction to the surface of the cutting tool body; and by calculating the average value of the grains within the measurement range. The measurement results are shown in Tables 5 and 6.

In the condition where the cross section of the hard coating layer, which was made of the Ti and Al complex carbonitride layer, in the perpendicular direction to the surface of the cutting tool body was polished to be a polished surface, the area ratio occupied by the cubic crystal phase in the region A layer; and the area ratio occupied by the hexagonal crystal phase in the region B layer, were obtained: by setting the sample in the lens barrel of the electron backscatter diffraction apparatus; by irradiating an electron beam to each crystal grain existing within the measurement range in the above-described polished surface of the cross section in the condition where the angle of incidence was 70°, the accelerating voltage was 15 kV, and the irradiation current was 1 nA; by measuring the electron backscatter diffraction pattern in the length of 100 μm in the direction horizontal to the cutting tool body at the interval of 0.01 μm/step in the hard coating layer; and by identifying whether each of crystals was in the cubic crystal structure or in the hexagonal crystal structure by analyzing the crystal structure of each crystal grain, by using an electron backscatter diffraction apparatus. The results are shown in Tables 5 and 6.

In addition, in regard to the complex carbonitride layer, an X-ray diffraction test was performed by using an X-ray diffractometer, Cu-Kα ray being the radiation source, to obtain the lattice constant, a, of the cubic crystal grains. The diffraction peak of the cubic crystal grain in the complex carbonitride layer was identified by confirming the diffraction peak appearing between the diffraction angles shown in each equivalent crystal plane (for example, 36.66-38.53°, 43.59-44.77°, and 61.81-65.18° shown in the cubic crystal TiN of JCPDS00-038-1420 and the cubic crystal AlN of JCPDS00-046-1200.

TABLE 1

| Type | | Blending composition (mass %) | | | | | | |
|------|---|-----|-----|-----|-----|-----|--------|---------|
| | | Co | TiC | ZrC | TaC | NbC | $Cr_3C_2$ | WC |
| Cutting tool body | A | 8.0 | 1.5 | — | — | 3.0 | 0.4 | Balance |
| | B | 8.0 | — | — | 1.8 | 0.2 | — | Balance |
| | C | 9.0 | — | 0.5 | 0.9 | 0.1 | 0.5 | Balance |
| | D | 10.0 | — | — | 1.8 | 0.2 | 0.6 | Balance |

TABLE 2

| Type | | Blending composition (mass %) | | | | | | | |
|------|---|-----|----|-----|-----|-----|--------|-----|------|
| | | Co | Ni | ZrC | TaC | NbC | $Mo_2C$ | WC | TiCN |
| Cutting tool body | a | 12 | 6 | — | 10 | — | 10 | 16 | Balance |
| | b | 7 | 7 | — | 5 | — | 7.5 | — | Balance |
| | c | 9 | 6 | — | 11 | 2 | — | — | Balance |
| | d | 8 | 5 | 1 | 8 | — | 10 | 10 | Balance |

TABLE 3

| Alternate laminated layer formation | | Formation condition (pressure and temperature of the reaction atmosphere are expressed in kPa and °C., respectively) | | |
|---|---|---|---|---|
| Formation layer type | Formation symbol | Reaction gas composition (volume %) | Reaction atmosphere Pressure | Temperature |
| Region A layer | A | TiCl$_4$: 4.0%, Al(CH$_3$)$_3$: 4%, AlCl$_3$: 1%, NH$_3$: 8%, N$_2$: 6%, C$_2$H$_4$: 0%, Balance H$_2$ | 4 | 700 |
|  | B | TiCl$_4$: 4.0%, Al(CH$_3$)$_3$: 5%, AlCl$_3$: 1%, NH$_3$: 7%, N$_2$: 8%, C$_2$H$_4$: 0.5%, Balance H$_2$ | 2 | 800 |
|  | C | TiCl$_4$: 3.0%, Al(CH$_3$)$_3$: 5%, AlCl$_3$: 2%, NH$_3$: 10%, N$_2$: 6%, C$_2$H$_4$: 0%, Balance H$_2$ | 5 | 700 |
|  | D | TiCl$_4$: 3.5%, Al(CH$_3$)$_3$: 4%, AlCl$_3$: 2%, NH$_3$: 8%, N$_2$: 10%, C$_2$H$_4$: 1%, Balance H$_2$ | 2 | 800 |
|  | E | TiCl$_4$: 3.0%, Al(CH$_3$)$_3$: 3%, AlCl$_3$: 1%, NH$_3$: 10%, N$_2$: 8%, C$_2$H$_4$: 0%, Balance H$_2$ | 4 | 900 |
|  | a | TiCl$_4$: 4.0%, Al(CH$_3$)$_3$: 4%, AlCl$_3$: 4%, NH$_3$: 3%, N$_2$: 15%, C$_2$H$_4$: 0%, Balance H$_2$ | 4 | 700 |
| Region B layer | F | TiCl$_4$: 1.0%, Al(CH$_3$)$_3$: 1%, AlCl$_3$: 4%, NH$_3$: 3%, N$_2$: 10%, C$_2$H$_4$: 0%, Balance H$_2$ | 4 | 800 |
|  | G | TiCl$_4$: 2.0%, Al(CH$_3$)$_3$: 2%, AlCl$_3$: 4%, NH$_3$: 3%, N$_2$: 8%, C$_2$H$_4$: 0%, Balance H$_2$ | 5 | 800 |
|  | H | TiCl$_4$: 2.0%, Al(CH$_3$)$_3$: 1%, AlCl$_3$: 5%, NH$_3$: 5%, N$_2$: 8%, C$_2$H$_4$: 1%, Balance H$_2$ | 2 | 700 |
|  | I | TiCl$_4$: 1.0%, Al(CH$_3$)$_3$: 2%, AlCl$_3$: 5%, NH$_3$: 5%, N$_2$: 6%, C$_2$H$_4$: 0.5%, Balance H$_2$ | 2 | 700 |
|  | J | TiCl$_4$: 1.5%, Al(CH$_3$)$_3$: 1%, AlCl$_3$: 3%, NH$_3$: 6%, N$_2$: 6%, C$_2$H$_4$: 0%, Balance H$_2$ | 4 | 900 |
|  | f | TiCl$_4$: 1.0%, Al(CH$_3$)$_3$: 1%, AlCl$_3$: 2%, NH$_3$: 8%, N$_2$: 15%, C$_2$H$_4$: 0%, Balance H$_2$ | 4 | 800 |

TABLE 4

| Constituting layer of hard coating layer | | | Formation condition (pressure and temperature of the reaction atmosphere are expressed in kPa and °C., respectively) | | |
|---|---|---|---|---|---|
| Type | | Formation symbol | Reaction gas composition (volume %) | Reaction atmosphere Pressure | Temperature |
| (Ti$_{1-x}$Al$_x$)(C$_y$N$_{1-y}$) layer | TiAlCN | TiAlCN | Refer Table 3 | 7 | 1000 |
| Ti compound layer | TiC | TiC | TiCl$_4$: 4.2%, CH$_4$: 8.5%, H$_2$: balance | 7 | 1020 |
|  | TiN | TiN | TiCl$_4$: 4.2%, N$_2$: 30%, H$_2$: balance | 30 | 900 |
|  | l-TiCN | l-TiCN | TiCl$_4$: 2%, CH$_3$CN: 0.7%, N$_2$: 10%, H$_2$: balance | 7 | 900 |
|  | TiCN | TiCN | TiCl$_4$: 2%, CH$_4$: 1%, N$_2$: 15%, H$_2$: balance | 13 | 1000 |
|  | TiCO | TiCO | TiCl$_4$: 4.2%, CO: 4%, H$_2$: balance | 7 | 1020 |
|  | TiCNO | TiCNO | TiCl$_4$: 2%, CO: 1%, CH$_4$: 1%, N$_2$: 5%, H$_2$: balance | 13 | 1000 |
| Al$_2$O$_3$ layer | Al$_2$O$_3$ | Al$_2$O$_3$ | AlCl$_3$: 2.2%, CO$_2$: 5.5%, HCl: 2.2%, H$_2$S: 0.2%, H$_2$: balance | 7 | 1000 |

TABLE 5

| | | | Hard coating layer Complex carbonitride layer | | | | | | | | | |
|---|---|---|---|---|---|---|---|---|---|---|---|---|
| | | | Region A layer | | | | | | Region B layer | | | |
| Type | Cutting tool body symbol | Formation symbol | Al content ratio x | C content ratio y | Ave. grain width W (μm) | Ave. grain Length L (μm) | Cubic crystal area ratio (%) | Ave. layer thickness value per a single layer (μm) | Formation symbol | Al content ratio x | C content ratio y | Ave. grain width W (μm) | Ave. grain Length L (μm) |
| Coated tool of the present invention | 1 | a | A | 0.70 | 0.0005 | 0.05 | 0.06 | 43* | 2 | F | 0.92 | 0.0005 | 0.3 | 1.9 |
| | 2 | A | B | 0.72 | 0.0041 | 0.07 | 0.08 | 67 | 3.5 | G | 0.86 | 0.0026 | 1.3 | 3.0 |
| | 3 | b | C | 0.79 | 0.0032 | 0.08 | 0.08 | 50 | 0.4 | H | 0.90 | 0.0050 | 0.1 | 0.5 |
| | 4 | B | D | 0.77 | 0.0050 | 0.10 | 0.10 | 65 | 4 | I | 0.94 | 0.0031 | 2.0 | 5.0 |
| | 5 | c | E | 0.75 | 0.0015 | 0.09 | 0.08 | 78 | 1 | J | 0.85 | 0.0022 | 0.6 | 1.1 |
| | 6 | C | A | 0.71 | 0.0009 | 0.04 | 0.06 | 39* | 1.2 | H | 0.89 | 0.0042 | 0.2 | 0.7 |
| | 7 | d | B | 0.73 | 0.0045 | 0.06 | 0.08 | 68 | 0.5 | I | 0.95 | 0.0025 | 1.6 | 2.2 |
| | 8 | D | C | 0.80 | 0.0023 | 0.06 | 0.07 | 62 | 2 | J | 0.87 | 0.0016 | 0.4 | 1.6 |
| | 9 | A | D | 0.77 | 0.0042 | 0.09 | 0.09 | 59 | 1.2 | F | 0.91 | 0.0009 | 0.6 | 1.3 |
| | 10 | a | E | 0.74 | 0.0019 | 0.08 | 0.07 | 71 | 1.5 | G | 0.88 | 0.0013 | 1.4 | 1.6 |
| | 11 | C | A | 0.71 | 0.0009 | 0.04 | 0.06 | 39* | 3.5 | G | 0.86 | 0.0026 | 1.3 | 3.0 |
| | 12 | d | B | 0.73 | 0.0045 | 0.06 | 0.08 | 68 | 0.4 | H | 0.90 | 0.0050 | 0.1 | 0.5 |
| | 13 | D | C | 0.80 | 0.0023 | 0.06 | 0.07 | 62 | 4 | I | 0.94 | 0.0031 | 2.0 | 5.0 |
| | 14 | A | D | 0.77 | 0.0042 | 0.09 | 0.09 | 59 | 1 | J | 0.85 | 0.0022 | 0.6 | 1.1 |
| | 15 | a | E | 0.74 | 0.0019 | 0.08 | 0.07 | 71 | 2.8 | F | 0.92 | 0.0005 | 0.3 | 1.9 |

TABLE 5-continued

| | | Hard coating layer | | | | | | | | | | | |
|---|---|---|---|---|---|---|---|---|---|---|---|---|---|
| | | Complex carbonitride layer | | | | | | | | | | | |
| | | Region B layer | | | | Hardness of the outermost layer of the alternate laminated structure (mgf/mm²) | Intended total layer thickness (μm) | Ratio of the complex carbonitride layer relative to the hard coating layer (%) | Lower layer of carbonitride layer | | | Upper layer of carbonitride layer | |
| Type | | Hexagonal crystal area ratio (%) | Ave. layer thickness value per a single layer (μm) | Number of lamination times (times) | Cubic crystal lattice constant (Å) | | | | 1st Lower layer | 2nd Lower layer | 3rd Lower layer | 1st Upper layer | 2nd Upper layer |
| Coated tool of the present invention | 1 | 68 | 3 | 2 | 4.101 | 4070 | 5 | 100 | — | — | — | — | — |
| | 2 | 59 | 3.5 | 2 | 4.095 | 4490 | 7 | 100 | — | — | — | — | — |
| | 3 | 55 | 0.6 | 2 | 4.078 | 5130 | 1 | 100 | — | — | — | — | — |
| | 4 | 61 | 6 | 2 | 4.082 | 5030 | 10 | 100 | — | — | — | — | — |
| | 5 | 46* | 1.2 | 8 | 4.087 | 4910 | 9 | 100 | — | — | — | — | — |
| | 6 | 58 | 0.8 | 6 | 4.099 | 4080 | 6 | 100 | — | — | — | — | — |
| | 7 | 66 | 4 | 4 | 4.093 | 4570 | 9 | 100 | — | — | — | — | — |
| | 8 | 50 | 2 | 2 | 4.075 | 5480 | 4 | 100 | — | — | — | — | — |
| | 9 | 72 | 1.5 | 6 | 4.083 | 4920 | 8 | 100 | — | — | — | — | — |
| | 10 | 57 | 2 | 4 | 4.090 | 4710 | 7 | 100 | — | — | — | — | — |
| | 11 | 59 | 3.5 | 2 | 4.099 | 4120 | 7 | 64 | TiN (0.5) | — | — | TiCNO (0.5) | Al₂O₃ (3) |
| | 12 | 55 | 0.6 | 2 | 4.093 | 4430 | 1 | 50 | TiC (1) | — | — | — | — |
| | 13 | 61 | 6 | 2 | 4.075 | 5300 | 10 | 67 | — | — | — | Al₂O₃ (5) | — |
| | 14 | 46* | 1.2 | 8 | 4.083 | 4850 | 9 | 67 | TiN (0.5) | 1-TiCN (4) | — | — | — |
| | 15 | 68 | 2.2 | 2 | 4.090 | 4700 | 5 | 45 | TiN (0.3) | 1-TiCN (2) | TiCN (0.7) | TiCO (1) | Al₂O₃ (2) |

Note 1:
The asterisk mark in the Table indicates that the parameter is out of the range defined in the second scope of the present invention.
Note 2:
The number of lamination times indicates the total number of the layer of the region A and B layers.

TABLE 6

| | | | Hard coating layer | | | | | | | | | | |
|---|---|---|---|---|---|---|---|---|---|---|---|---|---|
| | | | Complex carbonitride layer | | | | | | | | | | |
| | | | Region A layer | | | | | | | Region B layer | | | |
| Type | | Cutting tool body symbol | Formation symbol | Al content ratio x | C content ratio y | Ave. grain width W (μm) | Ave. grain length L (μm) | Cubic crystal area ratio (%) | Ave. layer thickness value per a single layer (μm) | Formation symbol | Al content ratio x | C content ratio y | Ave. grain width W (μm) | Ave. grain Length L (μm) |
| Comparative coated tool | 1 | a | A | 0.70 | 0.0004 | 0.08 | 0.06 | 38 | — | | | | | |
| | 2 | A | B | 0.75 | 0.0053 | 0.12 | 0.11 | 65 | — | | | | | |
| | 3 | b | C | 0.80 | 0.0029 | 0.10 | 0.08 | 48 | 0.3 | f | 0.78* | 0.0005 | 0.3 | 0.6 |
| | 4 | B | a | 0.88* | 0.0012 | 0.15* | 0.13* | 38 | 2 | G | 0.88 | 0.0023 | 1.6 | 2.8 |
| | 5 | c | | No region A layer | | | | | | H | 0.90 | 0.0050 | 0.2 | 0.6 |
| | 6 | C | | No region A layer | | | | | | I | 0.94 | 0.0031 | 2.0 | 5.3 |
| | 7 | d | | No region A layer | | | | | | F | 0.92 | 0.0005 | 0.3 | 1.3 |
| | | | | | | | | | | J | 0.85 | 0.0022 | 0.6 | 1.8 |
| | 8 | D | D | 0.77 | 0.0043 | 0.11 | 0.12 | 68 | 0.8 | No region B layer | | | | |
| | | | E | 0.74 | 0.0015 | 0.07 | 0.08 | 73 | 0.5 | | | | | |
| Reference coated tool | 9 | A | AIP | 0.78 | 0.0001 or less | 0.12 | 0.18 | 0 | — | No region B layer | | | | |
| | 10 | a | AIP | 0.83* | 0.0001 or less | 0.14 | 0.20 | 0 | — | No region B layer | | | | |
| Comparative coated tool | 11 | a | A | 0.71 | 0.0004 | 0.08 | 0.06 | 38 | — | No region B layer | | | | |
| | 12 | A | B | 0.78 | 0.0053 | 0.12 | 0.11 | 65 | — | No region B layer | | | | |
| | 13 | b | C | 0.80 | 0.0029 | 0.10 | 0.08 | 48 | — | No region B layer | | | | |
| | 14 | B | | No region A layer | | | | | | G | 0.88 | 0.0023 | 5.6 | 7.2 |
| | 15 | c | | No region A layer | | | | | | H | 0.90 | 0.0050 | 0.2 | 0.6 |

TABLE 6-continued

| | | Complex carbonitride layer | | | | | | | | | | |
|---|---|---|---|---|---|---|---|---|---|---|---|---|
| | | Region B layer | | | | Hardness of the outermost layer of the alternate laminated structure (mgf/mm$^2$) | Intended total layer thickness (μm) | Ratio of the complex carbonitride layer relative to the hard coating layer (%) | Lower layer of carbonitride layer | | | Upper layer of carbonitride layer | |
| Type | | Hexagonal crystal area ratio (%) | Ave. layer thickness value per a single layer (μm) | Number of lamination times (times) | Cubic crystal lattice constant (Å) | | | | 1st Lower layer | 2nd Lower layer | 3rd Lower layer | 1st Upper layer | 2nd Upper layer |
| Comparative coated tool | 1 | — | — | — | 4.114 | 3730 | 5 | 100 | — | — | — | — | — |
| | 2 | — | — | — | 4.074 | 4590 | 7 | 100 | — | — | — | — | — |
| | 3 | 48 | 0.7 | 2 | 4.065 | 5480 | 1 | 100 | | | | | |
| | 4 | 60 | 3 | 4 | 4.081 | 4840 | 10 | 100 | | | | | |
| | 5 | 53 | — | — | 4.075 | 4330 | 9 | 100 | | | | | |
| | 6 | 58 | — | — | 4.065 | 5420 | 6 | 100 | | | | | |
| | 7 | 62 | 2 | 4 | 4.089 | 4460 | 9 | 100 | — | — | — | — | — |
| | 8 | 58 No region B layer | 2.5 | 6 | 4.09 | 4730 | 4 | 100 | | | | | |
| Reference coated tool | 9 | No region B layer | — | — | 4.083 | 4330 | 8 | 100 | | | | | |
| | 10 | No region B layer | — | — | 4.07 | 5330 | 7 | 100 | — | — | — | — | — |
| Comparative coated tool | 11 | No region B layer | — | — | 4.114 | 3750 | 7 | 64 | TiN (0.5) | — | — | TiCNO (0.5) | Al$_2$O$_3$ (3) |
| | 12 | No region B layer | — | — | 4.074 | 4500 | 1 | 50 | TiC (1) | — | — | — | — |
| | 13 | No region B layer | — | — | 4.065 | 5400 | 10 | 67 | — | — | — | Al$_2$O$_3$ (5) | — |
| | 14 | 60 | — | — | 4.081 | 4800 | 9 | 67 | TiN (0.5) | 1-TiCN (4) | — | — | — |
| | 15 | 53 | — | — | 4.075 | 4200 | 5 | 45 | TiN (0.3) | 1-TiCN (2) | TiCN (0.7) | TiCO (1) | Al$_2$O$_3$ (2) |

Note 1:
"ATP" indicates film formation by arc-ion plating.
Note 2:
The number of lamination times indicates the total number of the layer of the region A and B layers.
Note 3:
The asterisk mark in the Table indicates that the parameter is out of the range defined in the scope of the present invention.

Next, each of the coated tools described above was clamped on the face milling cutter made of tool steel with the cutter diameter of 125 mm by a fixing jig. Then, the center cut cutting test of high speed dry face milling was performed on the coated tools of the present invention 1-15; the comparative coated tools 1-8 and 11-15; and the reference coated tools 9 and 10, in the clamped-state. The center cut cutting test of high speed dry face milling is a type of high speed intermittent cutting of alloy steel, and was performed under the condition shown below. After the test, width of flank wear of the cutting edge was measured.

Work: Block material of JIS-SCM440 standard having width of 100 mm and length of 400 mm
Rotation speed: 943 min$^{-1}$
Cutting speed: 370 m/min
Cutting depth: 1 mm
Feed rate per tooth: 0.12 mm/tooth
Cutting time: 8 minutes
The results of the cutting test are shown in Table 7.

| Type | | Width of flank wear (mm) | Type | | Cutting test result (min) |
|---|---|---|---|---|---|
| Coated tool of the present invention | 1 | 0.14 | Comparative coated tool | 1 | 4.3* |
| | 2 | 0.11 | | 2 | 3.3* |
| | 3 | 0.11 | | 3 | 4.8* |
| | 4 | 0.08 | | 4 | 4.7* |
| | 5 | 0.13 | | 5 | 4.6* |
| | 6 | 0.13 | | 6 | 3.8* |
| | 7 | 0.09 | | 7 | 4.2* |
| | 8 | 0.07 | | 8 | 3.9* |
| | 9 | 0.10 | Reference coated tool | 9 | 2.3* |
| | 10 | 0.07 | | 10 | 2.1* |
| | 11 | 0.14 | Comparative coated tool | 11 | 3.7* |
| | 12 | 0.09 | | 12 | 4.2* |
| | 13 | 0.11 | | 13 | 3.5.* |
| | 14 | 0.12 | | 14 | 4.6* |
| | 15 | 0.10 | | 15 | 4.1* |

Asterisk marks in the column of the comparative and reference coated tool indicate the cutting time (min) until reaching to its service life due to occurrence of chipping.

Example 2

Tool bodies E-H were produced by the process explained below. First, as raw material powders, the cBN powder, the TiN powder, the TiCN powder, the TiC powder, the Al powder, and Al$_2$O$_3$ powder, all of which had the average grain sizes of 0.5-4 μm, were prepared. These raw material powders were blended in the blending composition shown in Table 9.

Then, the mixtures were wet-mixed for 80 hours with a ball mill. After drying, the mixtures were press-molded into green compacts with a dimension of: diameter of 50 mm; and thickness of 1.5 mm, under pressure of 120 MPa. Then, the obtained green compacts were sintered in vacuum in the condition of 1 Pa vacuum at the predetermined temperature in the range of 900-1300° C. for 60 minutes retention to obtain preliminary sintered bodies for the cutting edge pieces. The obtained preliminary sintered bodies were placed on separately prepared supporting pieces made of WC-based cemented carbide alloy, which had the composition of: 8 mass % of Co; and the WC balance, and the dimension of: diameter of 50 mm; and thickness of 2 mm. They were inserted into a standard ultra-high pressure sintering apparatus in the stacked state. Then, they were subjected to ultra-high-pressure sintering in the standard condition of: 4 GPa of pressure; a predetermined temperature within the range of 1200-1400° C.; and 0.8 hour of the retention time. Then, the top and bottom surfaces of the sintered bodies were grinded by using a diamond grind tool. Then, they were divided into a predetermined dimension with a wire-electrical discharge machine. Then, they were brazed on the brazing portion (corner portion) of the insert main cutting tool body made of WC-based cemented carbide alloy, which had the composition of: 5 mass % of Co; 5 mass % of TaC; and the WC balance, and the shape defined by ISO CNGA120412 standard (the diamond shape of: thickness of 4.76 mm; and inscribed circle diameter of 12.7 mm) by using the brazing material made of Ti—Zr—Cu alloy having composition made of: 37.5% of Zr; 25% of Cu; and the Ti balance in volume %. Then, after performing outer peripheral machining into a predetermined dimension, the cutting edges of the brazed parts were subjected to a honing work of: width of 0.13 mm; and angle of 25°. Then, by performing the final polishing on them, the tool bodies E-F with the insert shape defined by ISO CNGA120412 standard were produced.

Next, the coated tools of the present invention 16-20 indicated in Tables 9 were produced by vapor depositing the $(Ti_{1-X}Al_X)(C_YN_{1-Y})$ layer related to the present invention on the surfaces of the tool bodies E-F in intended thicknesses using a standard chemical vapor deposition apparatus in the conditions indicated in Table 3.

For comparison purposes, the comparative coated tools 6-19 indicated in Table 10 were produced by vapor depositing the comparative $(Ti_{1-X}Al_X)(C_YN_{1-Y})$ layer on the surface of the tool bodies E-F in intended thicknesses using a standard chemical vapor deposition apparatus in the conditions indicated in Table 3.

For reference, the reference coated tool 20 indicated in Table 10 was produced by vapor depositing the reference $(Ti_{1-X}Al_X)(C_YN_{1-Y})$ layer on the surface of the cutting tool body E in the intended thickness using a conventional physical vapor deposition apparatus by arc-ion plating.

The condition for the arc-ion plating was the same as described in Example 1. By vapor depositing $(Ti_{1-X}Al_X)(C_YN_{1-Y})$ layer on the surfaces of the above-mentioned cutting tool bodies in the intended average compositions and layer thicknesses indicated in Table 10 in the arc-ion plating, the reference coated tool 20 was produced.

Cross sections of each constituent layer of the coated cutting tools of the present invention 16-20; the comparative coated tools 16-19; and the reference coated tool 20, were subjected to measurement by using a scanning electron microscope (magnifying power: ×5000), and the average layer thicknesses were obtained by averaging layer thicknesses measured at 5 points within the observation viewing field. In any measurement, the obtained average layer thickness was practically the same as the intended total layer thicknesses shown in Tables 9 and 10.

In regard to the coated cutting tools of the present invention 16-20; the comparative coated cutting tools 16-19; and the reference coated tool 20, the average Al content ratio X and the average C content ratio Y in the hard coating layer; the average grain width W, and average grain length L of the $(Ti_{1-X}Al_X)(C_YN_{1-Y})$ layer with the micro granular structure constituting the region A layer; the average grain width W, and average grain length L of the $(Ti_{1-X}Al_X)(C_YN_{1-Y})$ layer with the columnar structure constituting the region B layer; the area ratio occupied by the cubic crystal phase in the region A layer; and the area ratio occupied by the hexagonal phase in the region B layer, were obtained as in the method indicated in Example 1. The measurement results are shown in Tables 9 and 10.

TABLE 8

|  |  | Blending composition (mass %) | | | | |
|---|---|---|---|---|---|---|
| Type | | TiN | TiCN | TiC | Al | Al$_2$O$_3$ | cBN |
| Cutting tool body | E | 30 | 20 | — | 12 | — | Balance |
|  | F | — | 35 | 5 | 8 | 2 | Balance |
|  | G | 15 | — | 30 | 6 | 5 | Balance |
|  | H | — | — | 25 | 6 | 4 | Balance |

TABLE 9

| | | | | Complex carbonitride layer | | | | | | |
|---|---|---|---|---|---|---|---|---|---|---|
| | | | | Region A layer | | | | | Region B layer | |
| Type | Cutting tool body symbol | Formation symbol | Al content ratio x | C content ratio y | Ave. grain width W (μm) | Ave. grain length L (μm) | Cubic crystal area ratio (%) | Ave. layer thickness value per a single layer (μm) | Formation symbol | Al content ratio x |
| Coated tool of the present invention | 16 | E | A | 0.70 | 0.0008 | 0.07 | 0.07 | 44* | 1 | J | 0.88 |
| | 17 | F | B | 0.72 | 0.0039 | 0.05 | 0.08 | 64 | 0.4 | H | 0.91 |
| | 18 | G | C | 0.76 | 0.0036 | 0.08 | 0.08 | 52 | 2 | I | 0.95 |
| | 19 | H | D | 0.75 | 0.0035 | 0.07 | 0.10 | 61 | 1.5 | F | 0.90 |
| | 20 | E | E | 0.73 | 0.0010 | 0.08 | 0.07 | 71 | 2 | G | 0.84 |

TABLE 9-continued

| | | Complex carbonitride layer | | | | | | |
|---|---|---|---|---|---|---|---|---|
| | | Region B layer | | | | | Hardness of the outermost layer of the alternate laminated structure (mgf/mm²) | Intended total layer thickness (μm) |
| Type | | C content ratio y | Ave. grain width W (μm) | Ave. grain length L (μm) | Ave. layer thickness value per a single layer (μm) | Number of lamination times (times) | Cubic crystal lattice constant (Å) | |
| Coated tool of the present invention | 16 | 0.0019 | 0.4 | 0.8 | 1 | 2 | 4.101 | 4080 | 2 |
| | 17 | 0.0048 | 0.2 | 0.5 | 0.6 | 8 | 4.095 | 4460 | 4 |
| | 18 | 0.0013 | 1.5 | 2.1 | 3 | 2 | 4.086 | 4690 | 5 |
| | 19 | 0.0007 | 0.3 | 1.2 | 1.5 | 2 | 4.088 | 4690 | 3 |
| | 20 | 0.0029 | 1.2 | 1.8 | 2 | 4 | 4.092 | 4630 | 8 |

Note 1:
The asterisk mark in the Table indicates that the parameter is out of the range defined in the second scope of the present invention.
Note 2:
The number of lamination times indicates the total number of the layer of the region A and B layers.

TABLE 10

| | | | | Hard coating layer | | | | | | | |
|---|---|---|---|---|---|---|---|---|---|---|---|
| | | | | Region A layer | | | | | | Region B layer | |
| Type | Cutting tool body symbol | Formation symbol | Al content ratio x | C content ratio y | Ave. grain width W (μm) | Ave. grain length L (μm) | Cubic crystal area ratio (%) | Ave. layer thickness value per a single layer (μm) | | Formation symbol | Al content ratio x |
| Comparative coated tool | 16 | E | B | 0.72 | 0.0039 | 0.05 | 0.08 | 64 | — | | No region B layer | |
| | 17 | F | | | No region A layer | | | | | | J | 0.86 |
| | 18 | G | | | No region A layer | | | | | | H | 0.89 |
| | | | | | | | | | | | F | 0.88 |
| | 19 | H | A | 0.71 | 0.0007 | 0.07 | 0.06 | 45 | 0.4 | | No region B layer | |
| | | | C | 0.74 | 0.0031 | 0.07 | 0.08 | 53 | 0.6 | | | |
| Reference coated tool | 20 | E | AIP | 0.79 | 0.0001 or less | 0.13 | 0.17 | 0 | — | | No region B layer | |

| | | Hard coating layer | | | | | | | |
|---|---|---|---|---|---|---|---|---|---|
| | | Region B layer | | | | | | | |
| Type | | C content ratio y | Ave. grain width W (μm) | Ave. grain length L (μm) | Hexagonal crystal area ratio (%) | Ave. layer thickness value per a single layer (μm) | Number of lamination times (times) | Cubic crystal lattice constant (Å) | Hardness of the outermost layer (mgf/mm²) | Intended total layer thickness (μm) |
| Comparative coated tool | 16 | | | No region B layer | | | — | 4.095 | 4460 | 2 |
| | 17 | 0.0014 | 0.4 | 3.2 | 49 | — | — | 4.086 | 3680 | 4 |
| | 18 | 0.0046 | 0.2 | 0.9 | 57 | 1.1 | 4 | 4.081 | 3770 | 5 |
| | | 0.0016 | 0.3 | 1.2 | 67 | 1.4 | | | | |
| | 19 | | | No region B layer | | | 6 | 4.099 | 4140 | 3 |
| Reference coated tool | 20 | | | No region B layer | | | — | — | 2440 | 8 |

Note 1:
The asterisk mark in the Table indicates that the parameter is out of the range defined in the second scope of the present invention.
Note 2:
The number of lamination times indicates the total number of the layer of the region A and B layers.

Next, each coated tool described above was screwed on the tip of the insert holder made of tool steel by a fixing jig. Then, the dry high speed intermittent cutting test of carbolized steel explained below were performed on the coated tools of the present invention 16-20; the comparative coated tools 16-19; and the reference coated tool 20. After the tests, width of flank wear of the cutting edge was measured.

Work: Round bar in JIS-SCM415 standard (hardness: HRC62) with 4 evenly spaced slits in the longitudinal direction Cutting speed: 240 m/min.
Cutting depth: 0.12 mm
Feed rate: 0.15 mm/rev.
Cutting time: 4 minutes Results of the cutting test are shown in Table 11.

TABLE 11

| Type | | Width of flank wear (mm) | Type | | Cutting test result (min) |
|---|---|---|---|---|---|
| Coated tool of the present invention | 16 | 0.12 | Comparative coated tool | 16 | 2.1* |
| | 17 | 0.08 | | 17 | 2.2* |
| | 18 | 0.07 | | 18 | 2.3* |
| | 19 | 0.09 | | 19 | 2.1* |
| | 20 | 0.10 | Reference coated tool | 20 | 1.6* |

Asterisk marks in the column of the comparative and reference coated tool indicate the cutting time (min) until reaching to its service life due to occurrence of chipping.

Based on the results shown in Tables 5, 7, 9, and 11, it was demonstrated that the surface coated cutting tools of the present invention had the hard coating layer with the alternate laminated structure of the region A layer with the micro granular structure and the region B layer with the columnar structure. In addition, it was demonstrated that toughness of the surface coated cutting tools of the present invention was improved. Also, the surface coated cutting tools of the present invention showed an excellent chipping resistance and an excellent fracturing resistance even if they were used in high speed intermittent cutting work of steel, casted iron, or the like, in which intermittent and impacting high load impinges on the cutting edge. Therefore, the surface coated cutting tools of the present invention exhibited an excellent wear resistance for a long-term usage.

Contrary to that, in regard to: the comparative coated tools 1-8 and 11-19; and the reference coated tools 9, 10, and 20, hard coating layers of which had the $(Ti_{1-X}Al_X)(C_YN_{1-Y})$ layer lacking the alternate laminated structure of the micro granular structured layer and the columnar structured layer, they reached to their service lives in a relatively short period of time due to occurrence of chipping, fracturing, or the like when they were used in the high speed intermittent cutting work in which intermittent and impacting high load impinges on the cutting edge.

INDUSTRIAL APPLICABILITY

The coated tool of the present invention can be utilized in high speed intermittent cutting of a wide variety of works as well as of alloy steel as described above. Furthermore, the coated cutting tool of the present invention exhibits an excellent chipping resistance and an excellent wear resistance for a long-term usage. Thus, the coated cutting tool of the present invention can be sufficiently adapted to high-performance cutting apparatuses; and labor-saving, energy-saving, and cost-saving of cutting work.

BRIEF DESCRIPTION OF THE REFERENCE SYMBOLS

1: Cutting tool body
2: Hard coating layer
3: Complex carbonitride layer $((Ti_{1-x}Al_x)(C_yN_{1-y}))$
4: Region A layer
5: Region B layer
6: Outermost layer
7: Intermediate layer

The invention claimed is:
1. A surface coated cutting tool comprising:
a cutting tool body made of any one of cemented carbide including tungsten carbide, cermet including titanium carbonitride, and ultra-high pressure sintered material including cubic boron nitride; and
a hard coating layer provided on a surface of the cutting tool body, wherein
the hard coating layer comprises at least a Ti and Al complex carbonitride layer formed by a chemical vapor deposition method,
the complex carbonitride layer includes an alternate laminated structure made of a region A layer and a region B layer, each of which is represented by a composition formula $(Ti_{1-x}Al_x)(C_yN_{1-y})$, the alternate laminated structure having an average total layer thickness of 1-10 µm,
in the region A layer, a content ratio x, which is an Al content relative to a total content amount of Ti and Al, satisfies $0.70 \leq x \leq 0.80$; a content ratio y, which is a C content relative to a total content amount of C and N, satisfies $0.0005 \leq y \leq 0.005$, each of x and y being atomic ratio; an average grain width W, which is an average value of grain width in a plane parallel to the surface of the cutting tool body, is 0.1 µm or less; and an average grain length L, which is an average value of grain length in a direction perpendicular to the surface of the cutting tool body, is 0.1 µm or less,
in the region B layer, a content ratio x, which is an Al content relative to a total content amount of Ti and Al, satisfies $0.85 \leq x \leq 0.95$; a content ratio y, which is a C content relative to a total content amount of C and N, satisfies $0.0005 \leq y \leq 0.005$, each of x and y being atomic ratio; an average grain width W, which is an average value of grain width in a plane parallel to the surface of the cutting tool body, is 0.1 µm to 2.0 µm; and an average grain length L, which is an average value of grain length in a direction perpendicular to the surface of the cutting tool body, is 0.5 µm to 5.0 µm,
the alternate laminated structure includes at least a pair of the region A layer and the region B layer which are alternately arranged, and
a top layer of the alternate laminated structure is the region A layer.
2. The surface coated cutting tool according to claim 1, wherein
in regard to the region A layer, in a case where a crystal orientation of each of crystal grains is analyzed in a vertical section direction of the Ti and Al complex carbonitride layer using an electron backscatter diffraction apparatus:
both of: a cubic crystal phase, in which an electron backscatter diffraction pattern of a cubic crystal lattice is observed; and a hexagonal crystal phase, in which an electron backscatter diffraction pattern of a hexagonal crystal lattice is observed, are detected; and
an area ratio of the cubic crystal phase relative to a total area of the cubic crystal phase and the hexagonal crystal phase is 50% or more, and
in regard to the region B layer, an area ratio of the hexagonal crystal phase relative to a total area of the cubic crystal phase and the hexagonal crystal phase is 50% or more.
3. The surface coated cutting tool according to claim 2, wherein
in a case where a lattice constant, a, of the cubic crystal grain is obtained in the complex carbonitride layer from X-ray diffraction, the lattice constant a of the cubic crystal grain satisfies a relationship, $0.05a_{TiN} + 0.95a_{AlN} \leq a \leq 0.4a_{TiN} + 0.6a_{AlN}$, relative to a lattice con- stant $a_{TiN}$, which is a lattice constant of a cubic TiN, and a lattice constant $a_{AlN}$, which is a lattice constant of a cubic AlN.

4. The surface coated cutting tool according to claim 1, wherein the hard coating layer is formed by a chemical vapor deposition method, a reaction gas component of which includes at least trimethyl aluminum.

5. The surface coated cutting tool according to claim 1, wherein an outermost layer, which is made of at least one layer selected from a group consisting of: $Al_2O_3$ layer; TiN layer; TiCN layer; and TiCNO layer, is formed on the Ti and Al complex carbonitride layer as a layer in an outermost part of the surface coated cutting tool.

6. The surface coated cutting tool according to claim 1, wherein an intermediate layer, which is made of TiN layer or TiCN layer, is formed between the surface of the cutting tool body and one of the region B layer closest to the cutting tool body.

7. The surface coated cutting tool according to claim 5, wherein an intermediate layer, which is made of TiN layer or TiCN layer, is formed between the surface of the cutting tool body and one of the region B layer closest to the cutting tool body.

8. The surface coated cutting tool according to claim 1, wherein an average total layer thickness of the complex carbonitride layer relative to an average layer thickness of the hard coating layer is 60% or more and 100% or less.

9. The surface coated cutting tool according to claim 1, wherein one of the region A layer farthest from the cutting tool body is the outermost layer of the surface coated cutting tool, and the one of the region B layer closest to the cutting tool body contacts the surface of the cutting tool body directly.

10. The surface cutting tool body according to claim 1, wherein a ratio between an average total layer thickness of the region A layer and an average total layer thickness of the region B layer is in a range between 1:9 to 9:1.

* * * * *